United States Patent
Dams et al.

(10) Patent No.: US 8,077,287 B2
(45) Date of Patent: Dec. 13, 2011

(54) METHOD OF PREPARING COMPONENTS, PREPARED COMPONENT, LITHOGRAPHIC APPARATUS AND DEVICE MANUFACTURING METHOD

(75) Inventors: Johannes Adrianus Antonius Theodorus Dams, Veldhoven (NL); Mark Kroon, Utrecht (NL); Harm-Jan Voorma, Zaltbommel (NL); Carolus Ida Maria Antonius Spee, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 1782 days.

(21) Appl. No.: 10/840,508

(22) Filed: May 7, 2004

(65) Prior Publication Data
US 2005/0008978 A1 Jan. 13, 2005

(30) Foreign Application Priority Data
May 9, 2003 (EP) .................................. 03252894

(51) Int. Cl.
*G03B 27/52* (2006.01)
*H02K 41/02* (2006.01)

(52) U.S. Cl. ...................... 355/30; 310/12.06
(58) Field of Classification Search ............ 355/30, 355/353, 72, 75, 53; 378/34, 35; 310/10, 310/12, 12.01–12.33
See application file for complete search history.

(56) References Cited

U.S. PATENT DOCUMENTS

| | | | | |
|---|---|---|---|---|
| 4,040,874 A * | 8/1977 | Yerman | ........................ | 148/33.3 |
| 5,357,158 A * | 10/1994 | Takei | ........................ | 310/12.24 |
| 5,370,903 A * | 12/1994 | Mine et al. | ................. | 427/126.2 |
| 5,439,849 A * | 8/1995 | McBride et al. | .............. | 438/763 |
| 5,549,934 A | 8/1996 | Garza et al. | .................... | 427/489 |
| 5,609,925 A | 3/1997 | Camilletti et al. | | |
| 5,989,983 A * | 11/1999 | Goo et al. | ....................... | 438/473 |
| 6,031,598 A * | 2/2000 | Tichenor et al. | ................. | 355/67 |
| 6,114,781 A * | 9/2000 | Hazelton et al. | ........... | 310/12.29 |
| 6,271,606 B1 | 8/2001 | Hazelton | | |
| 6,296,806 B1 | 10/2001 | Kishkovich et al. | | |
| 6,319,859 B1 * | 11/2001 | Tran | .............................. | 438/788 |
| 7,183,674 B2 * | 2/2007 | Koorneef et al. | ............... | 310/12 |
| 2002/0011182 A1 | 1/2002 | Matsuda et al. | | |
| 2002/0018195 A1* | 2/2002 | Iwamoto et al. | ................ | 355/72 |
| 2002/0145808 A1 | 10/2002 | Freitag et al. | | |
| 2003/0141769 A1* | 7/2003 | Kubo | .............................. | 310/12 |

(Continued)

FOREIGN PATENT DOCUMENTS
EP 1 204 002 A2 5/2002

(Continued)

OTHER PUBLICATIONS

Translation of JP application 2001-07899, filed Mar. 13, 2001.*

(Continued)

*Primary Examiner* — Hung Henry Nguyen
*Assistant Examiner* — Steven H Whitesell Gordon
(74) *Attorney, Agent, or Firm* — Pillsbury Winthrop Shaw Pittman LLP

(57) ABSTRACT

A method of preparing components for use in a vacuum chamber of a lithographic apparatus is disclosed. The method includes coating the component with a non-metallic material. The method may further include treating the coating so as to harden the coating. Preferably, the coating material is a hydrogen silsesquioxane (HSQ), which may be applied via spraying, brushing, or spinning and can be treated by heating or by irradiation with an electron beam. The resulting components strongly reduce outgassing of water and hydrocarbons when subjected to a vacuum environment.

22 Claims, 5 Drawing Sheets

U.S. PATENT DOCUMENTS

| | | | | |
|---|---|---|---|---|
| 2003/0227079 | A1* | 12/2003 | Chia et al. | 257/723 |
| 2004/0080217 | A1* | 4/2004 | Ota et al. | 310/12 |
| 2004/0115855 | A1* | 6/2004 | Tanenbaum et al. | 438/48 |
| 2005/0213060 | A1* | 9/2005 | Duisters et al. | 355/30 |

FOREIGN PATENT DOCUMENTS

| | | |
|---|---|---|
| EP | 1 233 501 A2 | 8/2002 |
| EP | 1 204 002 A3 | 3/2003 |
| JP | 06039959 A | 2/1994 |
| JP | 06267486 A | 9/1994 |
| JP | 200315645 A | 11/2000 |
| JP | 2001-153140 | 6/2001 |
| JP | 2002272086 A * | 9/2002 |
| WO | WO 00/13223 | 3/2000 |

OTHER PUBLICATIONS

Translation of Taiwanese Official Action for ROC (Taiwan) Patent Application No. 093112968, dated Feb. 6, 2006.

Translation of Japanese Official Action, dated Jul. 1, 2005.

* cited by examiner

METHOD OF PREPARING COMPONENTS, PREPARED COMPONENT, LITHOGRAPHIC APPARATUS AND DEVICE MANUFACTURING METHOD

CROSS-REFERENCE TO RELATED APPLICATIONS

This application claims the benefit of priority from European Patent Application No. 03252894.5, filed May 9, 2003, the content of which is incorporated herein by reference in its entirety.

BACKGROUND OF THE INVENTION

1. Field of the Invention

The present invention relates to a method of preparing components for use in a lithographic projection apparatus.

2. Description of Related Art

The term "patterning device" as here employed should be broadly interpreted as referring to a device that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include:

A mask. The concept of a mask is well known in lithography, and it includes mask types such as binary, alternating phase-shift, attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing a piezoelectric actuator. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step and scan apparatus—each target portion is irradiated by progressively scanning the mask pattern under the projection beam in a given reference direction (the "scanning" direction) while synchronously scanning the substrate table parallel or anti parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation sensitive material (resist). Prior to this imaging step, the substrate may undergo various procedures, such as priming, resist coating and a soft bake. After exposure, the substrate may be subjected to other procedures, such as a post exposure bake (PEB), development, a hard bake and measurement/inspection of the imaged features. This array of procedures is used as a basis to pattern an individual layer of a device, e.g. an IC. Such a patterned layer may then undergo various processes such as etching, ion implantation (doping), metallization, oxidation, chemo mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0 07 067250 4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, incorporated herein by reference.

Extreme ultraviolet lithography needs to be carried out in a ultra high vacuum environment because all matter, including atmospheric air, strongly absorbs extreme ultraviolet radiation within a distance ranging from a few millimeters (for gases) to nanometers (for solids). Even for lithography not utilizing extreme ultraviolet radiation, a vacuum or partial vacuum is desirable in order to reduce light absorption. The necessity of a vacuum system that all standard components of the lithographic system, such as stages, optics and sensors, are required to operate in a vacuum environment. Each of the components are connected to one another and the external world by a large number of connecting cables and pipes which transport electrical power, electrical signals and cooling water through the system.

There is therefore a necessity for a vacuum to be maintained in a chamber, which chamber comprises components made from a wide range of materials, ranging from stainless steel to soft plastics. Furthermore, the total surface area of all of the components in the vacuum chamber can be very large due to the fact that many of the components are wires or the like.

The components in their natural form have a certain surface roughness and surface porosity which allows atoms and molecules to be attached to them under atmospheric conditions during manufacturing. When such components are placed in a vacuum, the atoms and molecules are released thereby reducing the quality of the vacuum and placing an additional burden on the vacuum pump system (e.g. a turbo pump or cryo pump system) that is used to create the vacuum in the vacuum chamber. Furthermore, soft plastics emit plasticizers originating from the bulk of the material. Thus, the components located inside the vacuum chamber can contribute to what is known as "outgassing". Such outgassing results from the fact that the components release molecules into the vacuum from their surfaces. These molecules need to be pumped away by the vacuum pump system in operation. Furthermore, during operation of the lithographic system, the outgassing load on the vacuum pump systems becomes even more onerous due to the contributions from the fresh wafers from the outside world, hydrocarbons emitted from resists before and after radiation and wear and tear of all of the moving parts of the scanner system.

A similar outgassing problem occurs in lithographic projection apparatus not requiring a vacuum, for example 157 nm machines in which the light transmitting chamber is flushed with Nitrogen. Although no vacuum is present, outgassing still occurs (e.g. by diffusion) and the Nitrogen becomes contaminated which can lead to less reliable exposures.

BRIEF SUMMARY OF THE INVENTION

It would therefore be desirable to provide a way of reducing the problems associated with outgassing of components in the chamber.

This and other desires are addressed by the present invention which provides in its first aspect a method of preparing components to reduce outgassing inside a lithographic projection apparatus, the method includes coating a surface of the components with a non-metallic material. The lithographic apparatus includes a radiation system for supplying a projection beam of radiation; a support structure for supporting a patterning device, the patterning device serving to pattern the projection beam according to a desired pattern; a substrate table for holding a substrate; and a projection system for projecting the patterned beam onto a target portion of the substrate.

The coating of the components with a non-metallic material reduces the contamination originating from the components since any releasable molecules located on the surface of the component are prevented from escaping by the coating layer. Non-metallic materials are used because metallic materials can reduce the efficiency of nearby actuators (e.g. linear motors) and are a source of eddy currents that can damp down actuator signals. Non-plastic materials are preferably used because plastic materials can themselves be a source of outgassing and one aim of invention is to reduce outgassing. Suitable plastic materials (e.g. Teflon) can be used provided they do not themselves introduce an unacceptable outgassing load.

Preferably, the material is glass or glass-like since such materials are electrical insulators and have been found to be effective in preventing the escape of contaminants from the surface of components. Glass or glass-like coatings can be used to protect polymer components from degradation from direct EUV illumination or electron induced degradation. Without the coating, these two mechanisms can cause a large amount of outgassing. Thus, such coatings are useful in preventing outgassing from components such as cables and connectors. Preferably, the coating is a silica glass, although phospate glass and other types of glass can be used if need be.

Hydrogen silsesquioxane (HSQ) is a particularly preferred precursor material for the coating. It can be applied by spraying, brushing or spinning as a liquid composition and can then be treated so that it becomes hard and glass-like, that is to say, electrically insulating, amorphous and without showing any outgassing of water and/or hydrocarbons by itself after application. Instead of HSQ, a silsesquioxane (SQ) precursor material with one or more hydrocarbon groups attached can be used. Such coatings formed using such precursors are so-called "hybrid coatings", which have partly organic and partly inorganic features.

Other application techniques, for example PVD techniques such as sputtering or evaporation or CVD techniques can also be used for applying coatings onto the components.

The treating can include thermal treating or irradiation by electrons. When HSQ is used, the cage-like structure of the liquid composition is broken down into a solid amorphous quartz-like structure that is believed to be particularly effective at preventing outgassing.

A further advantage of the method according to the invention is that components of a lithography apparatus thus coated are less susceptible to chemicals e.g. used for cleaning the optics. For example, in extreme ultraviolet lithography Halogenide gasses might be used to clean the optics from contaminants or source debris. In order to protect electronic components vulnerable to the Halogenide gasses, these components may be encapsulated in an Epoxy type material, which can be coated according to the invention with the glass or glass-like material described.

In a second aspect, the invention provides a component for use in a lithographic projection apparatus, the component having a surface coated with 30 nm or more of a glass or glass-like material.

According to a third aspect of the invention, there is provided a lithographic projection apparatus that includes: a radiation system for providing a projection beam of radiation; a support structure for supporting a patterning device, the patterning device serving to pattern the projection beam according to a desired pattern; a substrate table for holding a substrate; a projection system for projecting the patterned beam onto a target portion of the substrate, characterized in that the apparatus comprises at least one component prepared according the first aspect of the invention or a component according to the second aspect of the invention.

According to a fourth aspect of the invention there is provided a device manufacturing method comprising the steps of: providing a substrate that is at least partially covered by a layer of radiation-sensitive material; providing a projection beam of radiation using a radiation system; using a patterning device to endow the projection beam with a pattern in its cross-section; projecting the patterned beam of radiation onto a target portion of the layer of radiation-sensitive material, characterized by using a component prepared according to the first aspect or a component according to the second aspect of the invention.

In another embodiment, a device manufacturing method is provided. The method includes: providing a beam of radiation with a radiation system; patterning the beam of radiation with a patterning device; projecting the patterned beam of radiation onto a layer of radiation-sensitive material disposed on a substrate; and moving a support that supports the patterning device or the substrate with a component that has been coated with a non-metallic material.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

DETAILED DESCRIPTION OF THE INVENTION

Lithographic Apparatus

Figure 1:
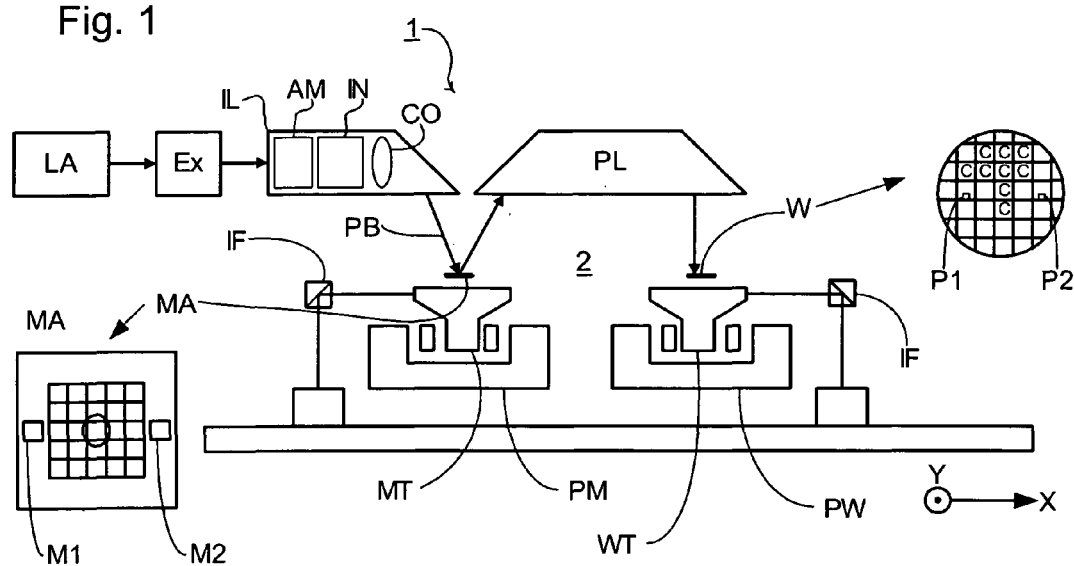
FIG. 1 depicts a lithographic projection apparatus according to an embodiment of the invention.

FIG. 1 schematically depicts a lithographic projection apparatus 1 that includes a vacuum chamber 2 using one or more components prepared according to any of the embodiments of the present invention. FIGS. 2-13 show alternative coating arrangements for the case when the invention is applied to an actuator system in the lithographic projection apparatus 1.

The apparatus 1 includes: a radiation system Ex, IL, for supplying a projection beam PB of radiation (e.g. EUV radiation), which in this particular case also includes a radiation source LA; a first object table (mask table) MT provided with a mask holder for holding a mask MA (e.g. a reticle), and connected to first positioning device PM for accurately positioning the mask with respect to item PL; a second object table (substrate table) WT provided with a substrate holder for holding a substrate W (e.g. a resist coated silicon wafer), and connected to second positioning device PW for accurately positioning the substrate with respect to item PL; a projection system ("lens") PL (e.g. mirror group) for imaging an irradiated portion of the mask MA onto a target portion C (e.g. comprising one or more dies) of the substrate W. The term table as used herein can also be considered or termed a support. It should be understood that the term support or table broadly refers to a structure that supports, holds, or carries a substrate.

As here depicted, the apparatus is of a reflective type (e.g. has a reflective mask). However, in general, it may also be of a transmissive type, for example (e.g. with a transmissive mask). Alternatively, the apparatus may employ another kind of patterning device, such as a programmable mirror array of a type as referred to above.

The source LA (e.g. a laser-produced or discharge plasma source) produces a beam of radiation. This beam is fed into an illumination system (illuminator) IL, either directly or after having a traversed conditioning device, such as a beam expander Ex, for example. The illuminator IL may comprise an adjusting device AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and Claims encompass both of these scenarios.

The beam PB subsequently intercepts the mask MA, which is held on a mask table MT. Having been selectively reflected by the mask MA, the beam PB passes through the lens PL, which focuses the beam PB onto a target portion C of the substrate W. With the aid of the second positioning device PW (and interferometric measuring device IF), the substrate table WT can be moved accurately, e.g. so as to position different target portions C in the path of the beam PB. Similarly, the first positioning device can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:
1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;
2. In scan mode, essentially the same scenario applies, except that a given target portion C is not exposed in a single "flash". Instead, the mask table MT is movable in a given direction (the so called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

In a practical embodiment of the lithographic projection apparatus, the spaces through which the EUV radiation beam travels will be evacuated by means of a vacuum pumping system. The chamber in which the vacuum is to be maintained will typically comprise many components made of a variety of materials. For example, wires intended for transmitting electrical currents will often traverse the vacuum chamber and such wires may be manufactured from an inner metal core with a plastics material surround. Soft plastic materials typically used for wires emit molecules over time contributing to the outgassing burden that the vacuum pumping system needs to remove. Also, the coils and magnets of the actuator system used to position the various tables can cause outgassing. The present invention thus comprises a method of preparing components before they are placed in the vacuum environment and after they have been manufactured. The invention can also be used in other situations where outgassing reduction is desirable, for example, to coat components used in the Nitrogen flushed chamber of a 157 nm wavelength lithographic apparatus. The preferred method has two stages:—
1. Coating the component with a non-metallic liquid composition; and
2. Treating the coated component to harden the coating layer and to make it effective at preventing outgassing.

The invention is particularly applicable to coat the coils of a linear actuator used for moving the tables of the lithographic apparatus. The coating is preferable to the chamber wall (20) disclosed in U.S. Pat. No. 6,271,606 which, due to its stainless steel material, is susceptible to eddy currents and results in a loss in efficiency of the linear motor because of the increased gap between the magnets needed to fit the stainless steel plates. Furthermore, the present invention has an advantage over the metal film disclosed in EP 1,233,501 which also suffers from the problem of eddy currents and is not very efficient at preventing outgassing. Metal coatings are also difficult to apply because it is necessary to carefully control the deposition process to control the crystal structure and avoid pinholes.

1. Coating

Any non-metallic material can be used. The material is preferably a non-plastic material. Glass or glass-like materials are preferred because they have been found to be particularly effective. Such materials include diamond and a family of materials known under the generic name Silsesquioxane (SQ). These chemicals have the general basic formula $RSiO_{1.5}$ where substituent R is an atom or molecule that can bond with silicon, for example a polymerizable organic group such as hydrido, glycidyl, methyl, vinyl, propyl, methacrylate, cyclohexenyl, cyclohexenyl epoxide etc. The molecules are usually represented in a cubic structure with a silicon atom at each cube corner. This cubic structure has the basic formula $(RSi)_8O_{12}$ with each silicon atom being bound to three oxygen atoms and the substituent R.

Hydrogen Silsesquioxane (HSQ) has been used in the past as a resist material for electron beam patterning applications but its use as an outgassing prevention material has not heretofore been suggested. It is particularly suitable because it can be applied to the component using a variety of convenient methods. For example, it can simply be sprayed or brushed onto the component so as to cover all of the potential outgassing surfaces and to clog all outgassing micro-pores with a sufficiently thick layer of material. More preferably, the liquid composition can be applied using a spinning process, for example, using a Karl Suss spinner having a lid. Application of the material not only fills in surface micro-pores but also helps to planarize the material by reducing surface roughness. Once treated, the material coating strongly reduces the outgassing of water and hydrocarbons that would otherwise occur from the porous surfaces and plastic surfaces of the components. Any SQ precursor may be used, preferably with one or more hydrocarbon groups attached.

The method may be applied to any components, so long as it does not hinder the functioning of the component itself. For example, printed circuit boards, electric cables, support surfaces, actuators and the like may all be coated.

The preferred HSQ material for the coating is available commercially, for example, from Dow-Corning under the reference FOX-12. This material initially shows liquid-like properties which enables the coating of the outgassing surfaces and parts, covering the surfaces and filling the micropores.

The coating layer may be applied to any desired thickness, but a thickness of at least 30 nm is preferred to ensure good outgassing prevention capability. Thicknesses of between about 100 nm and of the order of 1 micron will allow the component to retain some of its inherent flexibility whereas great thicknesses will cause a rigid coating to be prepared on the component. Hybrid coatings may be thicker whilst still retaining flexibility.

2. Treatment

Two methods may be used to treat the coated component so as to harden the coating layer and permanently reduce the outgassing capability of the component.

The first method is a thermal treatment method whereby the surface of the component is heated up. This changes the chemical structure of the coating layer so as to harden it. It can be achieved by placing the component in an oven at 100 to 500° C., more preferably 200 to 400° C. to carry out the desired effect.

The second method is to irradiate the surface of the component using a wavelength of a radiation that will cause the desired transformation. Infrared radiation may be used to cause heating of the surface and such treatment works in a similar way to the thermal treatment. Alternatively, an electron beam may be used, particularly when a HSQ material is used for the coating material, which exposes the coating material, changing its chemical structure from a cage-like structure to an amorphous quartz-like structure.

The change in structure leaves a hard surface on the component that strongly reduces outgassing even when the component is placed in a vacuum.

Once the coating and treating steps have been carried out, the component is available for use in the lithographic projection apparatus. If desired, the coating-developing cycle can be repeated one or more further times to reduce the outgassing potential of the components still further. The components may then be further processed if necessary or be used straight away in the lithographic apparatus.

Polymer coatings are good at adhering to the component but are less successful at reducing outgassing. Thus, a two or more stage process in which a polymer coating is initially used and is followed by a glass-like top coating allows one to benefit from the advantages of both types of coating whilst maintaining excellent outgassing reduction.

It is to be understood that the term "vacuum" is used in this description to refer to the degree of vacuum commonly found in lithographic projection devices. It is not to be strictly interpreted as requiring a pure vacuum. A partial vacuum will suffice.

Examples

FIGS. 2 to 13 show various examples of the invention applied to components used in an actuator system.

Figure 2:
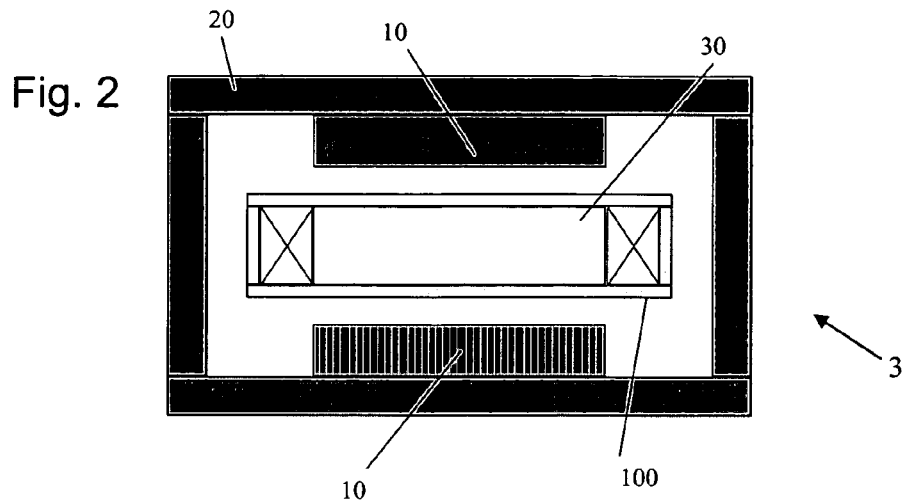
FIG. 2 is a schematic view of one embodiment of an actuator of the lithographic projection apparatus of FIG. 1.
Figure 3:
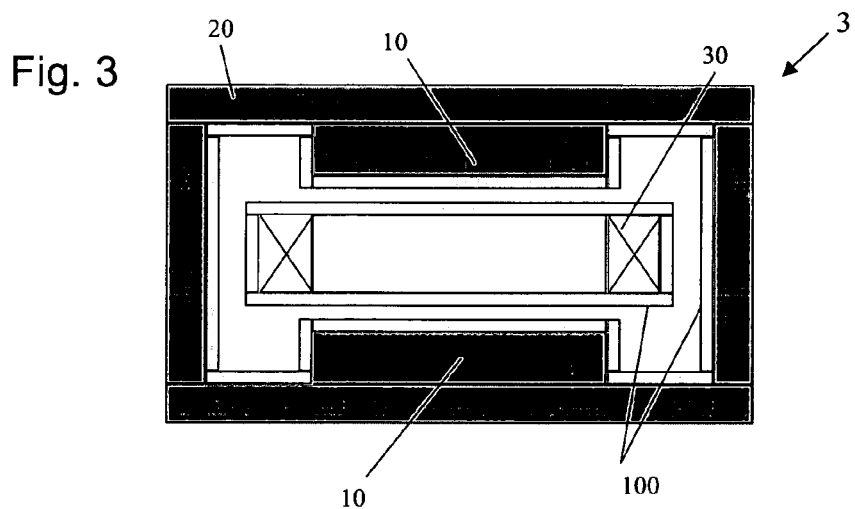
FIG. 3 is a schematic view of a variation of the actuator of FIG. 2.

FIGS. 2 and 3 show an enclosed actuator system 3 in which the central component comprising the coil 30 moves with respect to the yoke 20 in a direction perpendicular to the plane of the drawing. The inner chamber is held in a vacuum and, to reduce outgassing, the coil 30 can be coated with a coating 100 as described above (see FIGS. 2 and 3). The coil 30 in each of these examples is typically glued to its support component using an epoxy-based resin and for this reason, coatings that can be applied and treated using low temperature steps (e.g. less than 200° C.) are preferred. The internal parts of the yoke 20 and magnet 10 can also be coated, as shown in FIG. 3.

Figure 4:
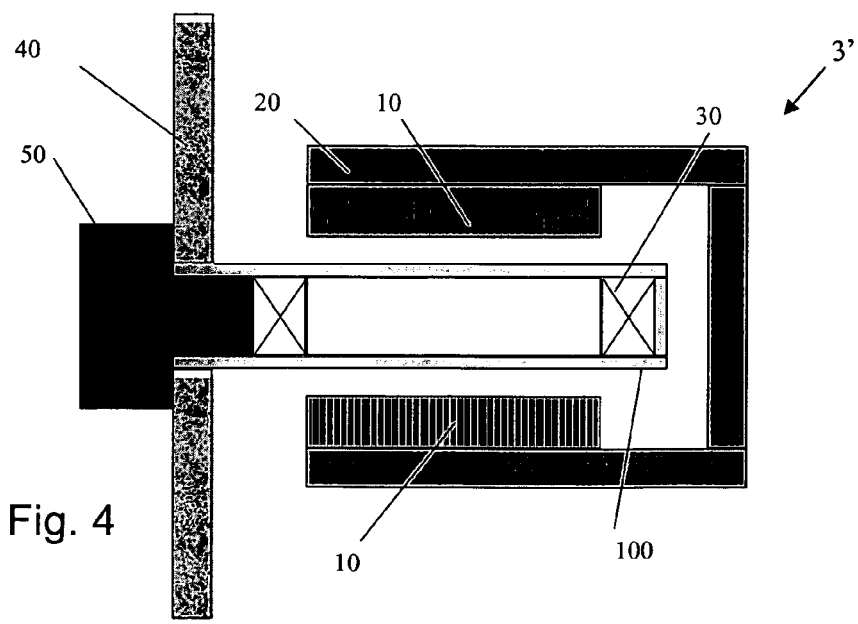
FIG. 4 is a schematic view of another embodiment of an actuator of the lithographic projection apparatus of FIG. 1.
Figure 5:
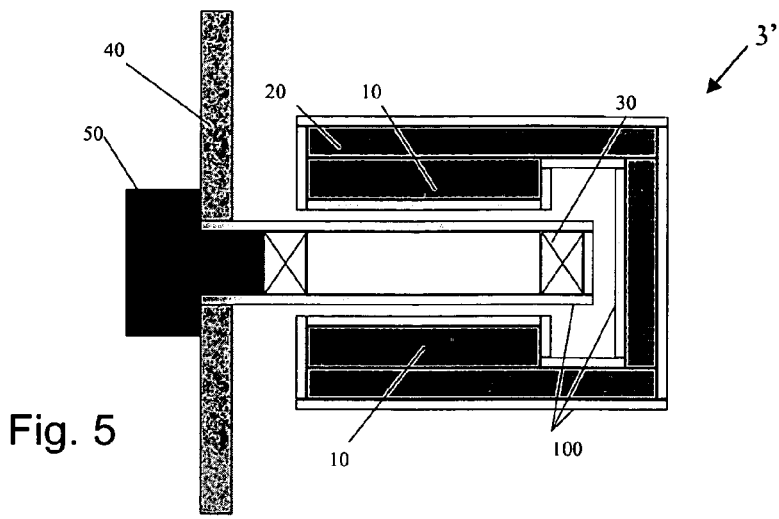
FIG. 5 is a schematic view of a variation of the actuator of FIG. 4.
Figure 6:
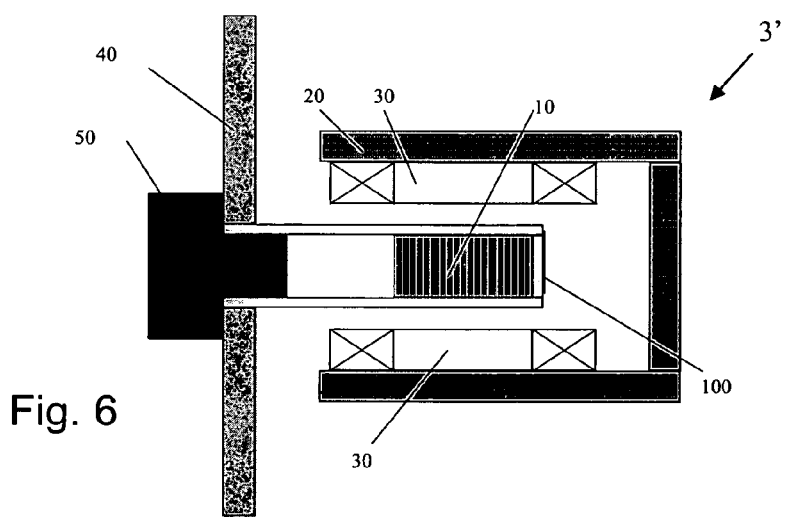
FIG. 6 is a schematic view of a another variation of the actuator of FIG. 4.
Figure 7:
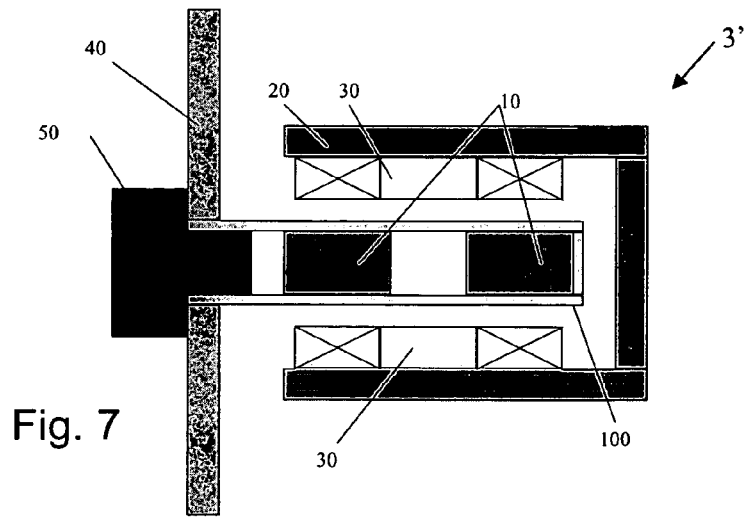
FIG. 7 is a schematic view of a further variation of the actuator of FIG. 4.
Figure 8:
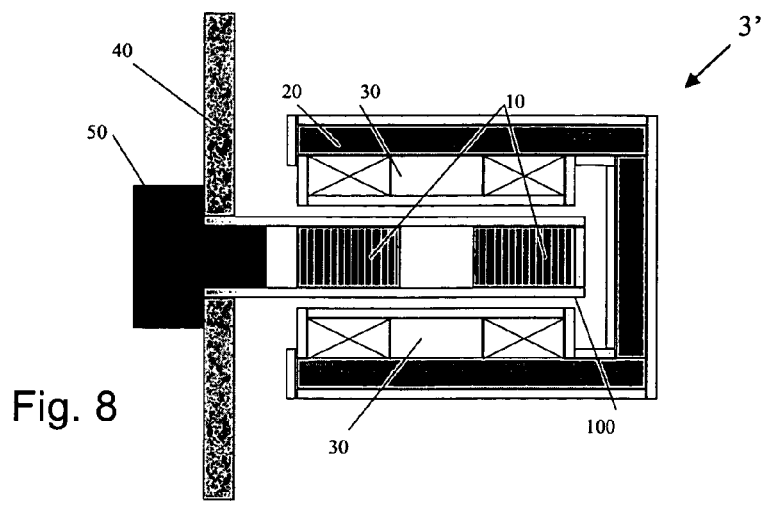
FIG. 8 is a schematic view of a yet another variation of the actuator of FIG. 4.

A second type of actuator 3' is shown in FIGS. 4 to 6. Here, the central component is fixed to a chamber wall 40 and the yoke component 20 moves around it in a direction perpendicular to the plane of the drawing. FIGS. 7 and 8 show a similar construction except the presence of two coils 30 and magnets 10 allows relative movement in the left-right direction of the drawing. The vacuum is maintained to the right of the chamber wall 40 as it is shown in FIGS. 4 to 8. The coil section 30 is supported by a support 50 in the chamber wall 40 in FIGS. 4 and 5 whereas the magnet section 10 is supported by the chamber wall 40 in FIGS. 6, 7 and 8. In each case, either the coil section 30 can be coated (see FIGS. 4, 5 and 8) or the magnet section 10 can be coated (see FIGS. 5, 6, 7 and 8) or both can be coated (see FIGS. 5 and 8). The coating is referenced 100 in each of FIGS. 2 to 13.

Figure 9:
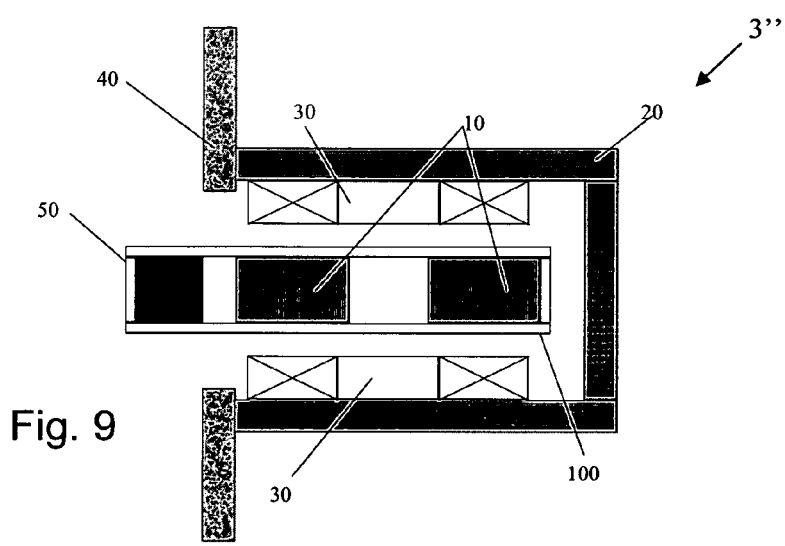
FIG. 9 is a schematic view of a further embodiment of an actuator of the lithographic projection apparatus of FIG. 1.
Figure 10:
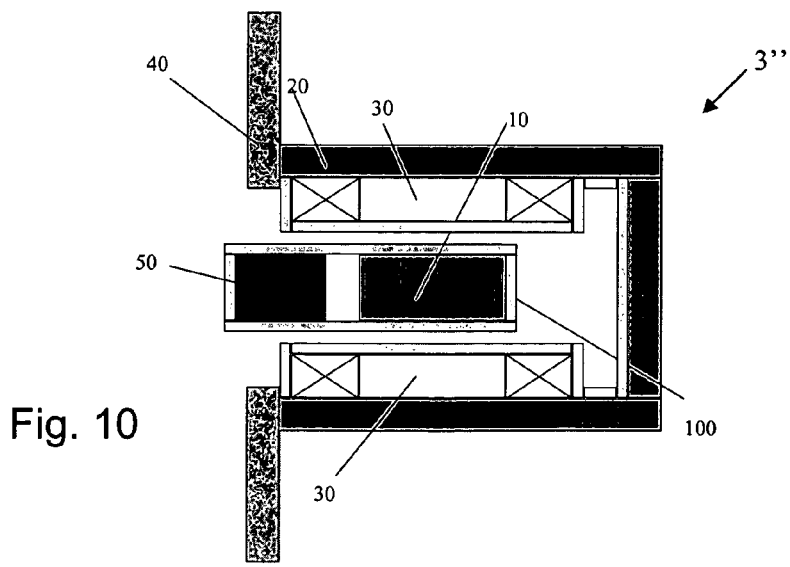
FIG. 10 is a schematic view of a variation of the actuator of FIG. 9.
Figure 11:
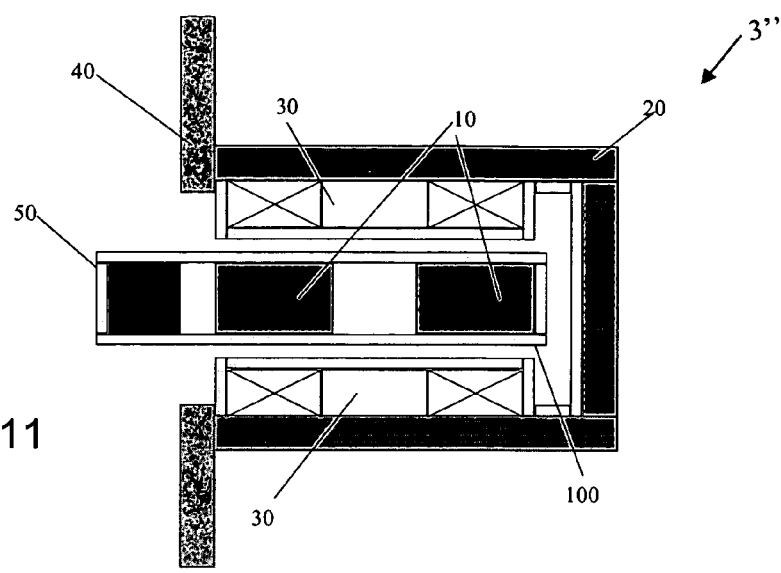
FIG. 11 is a schematic view of another variation of the actuator of FIG. 9
Figure 12:
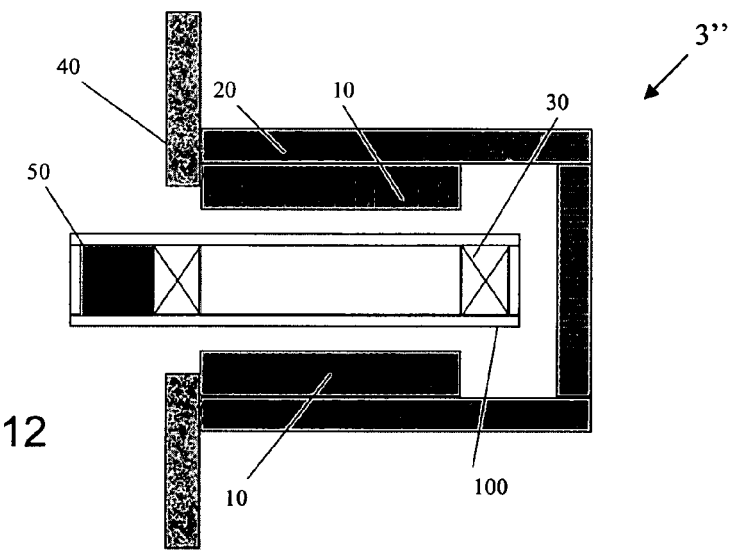
FIG. 12 is a schematic view of a further variation of the actuator of FIG. 9.
Figure 13:
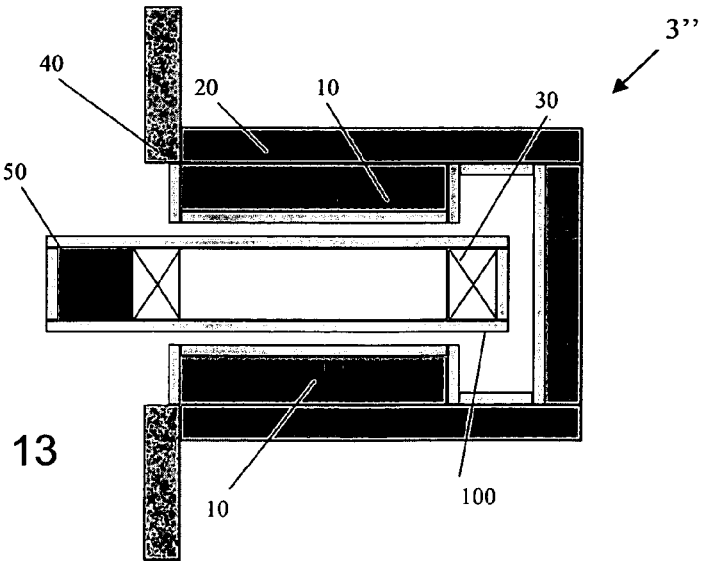
FIG. 13 is a schematic view of a yet another variation of the actuator of FIG. 9.

A third type of actuator 3" is shown in FIGS. 9 to 13. In FIGS. 10, 12 and 13, the yoke component 20 is fixed to a chamber wall 40 and the central component moves inside it in a direction perpendicular to the plane of the drawing. In FIGS. 9 and 11, the yoke component 20 is fixed to a chamber wall 40 and the central component moves inside it in a left-right direction in the plane of the drawing. In each case, the vacuum is maintained to the left of the chamber wall 40 as it is shown in FIGS. 9 to 13. A yoke section 20, comprising one or more coils 30, is supported by the chamber wall 40 in FIGS. 9, 10 and 11 whereas a yoke section 20 comprising one or more magnets 10 is shown in FIGS. 12 and 13. In each case, either the coil section 30 can be coated (see FIGS. 10, 11, 12 and 13) or the magnet section 10 can be coated (see FIGS. 9, 10, 11 and 13) or both can be coated (see FIGS. 10, 11 and 13).

While specific embodiments of the invention have been described above, it will be appreciated that the invention may be practiced otherwise than as described. The description is not intended to limit the invention.

What is claimed is:

1. A method of preparing a component of a lithographic projection apparatus to reduce outgassing inside the lithographic projection apparatus, said component comprising at least one of a coil, a magnet, or a yoke of an actuator, said method comprising:
    coating a surface of said component with a polymer; and
    coating the polymer with a non-metallic material, wherein said material is glass or a glass-like material, by applying a fluid composition of said material to the polymer.

2. A method according to claim 1, wherein said material is a silica glass.

3. A method according to claim 1, wherein said material is hydrogen silsesquioxane (HSQ) or a silsesquioxane precursor with one or more hydrocarbon groups attached.

4. A method according to claim 1, wherein said applying said fluid material comprises:
    spraying said fluid composition of said material onto said polymer.

5. A method according to claim 1, wherein said applying said fluid material comprises:
    brushing said fluid composition of said material onto said polymer.

6. A method according to claim 1, wherein said applying said fluid material comprises:
    spinning said fluid composition of said material onto said polymer.

7. A method according to claim 1, further comprising:
    treating said coated component to harden the non-metallic material.

8. A method according to claim 7, wherein said treated non-metallic material is a hard amorphous layer of electrically insulating material.

9. A method according to claim 7, wherein said treating said coated component comprises:
    heating the coated surface.

10. A method according to claim 9, wherein said heating is carried out at 100° C. to 500° C. for at least one minute.

11. A method according to claim 7, wherein said treating said coated component comprises:
irradiating the coated surface with an electron beam.

12. A method according to claim 7, wherein said treating said coated component comprises:
irradiating the coated surface using a wavelength of radiation which will cause the hardening of the non-metallic material.

13. A method according to claim 12, wherein the radiation is infrared radiation.

14. A method according to claim 1, wherein said non-metallic material is coated on top of the polymer to a thickness of at feast about 30 nm.

15. A component for use in a lithographic projection apparatus, said component comprising at least one of a coil, a magnet, or a yoke of an actuator, and said component having a surface coated with a polymer and at least about 30 nm to about 1 μm of a glass or glass-like material on top of the polymer.

16. A lithographic projection apparatus comprising:
a radiation system for providing a beam of radiation;
a support structure for supporting a patterning device, the patterning device constructed and arranged to pattern the beam of radiation according to a desired pattern;
a substrate support for supporting a substrate;
a projection system for projecting the patterned beam onto a target portion of the substrate; and
at least one component disposed within a vacuum chamber of said apparatus, said component comprising at least one of a coil, a magnet, or a yoke of an actuator, said component having a surface coated with a polymer and at least 30 nm to about 1 μm of a non-metallic material on top of the polymer, wherein said material is a glass or glass-like material.

17. A lithographic projection apparatus according to claim 16, wherein said material is a silica glass.

18. A lithographic projection apparatus according to claim 16, wherein said material is hydrogen silsesquioxane (HSQ) or a silsesquioxane precursor with one or more hydrocarbon groups attached.

19. A device manufacturing method comprising:
providing a substrate that is at least partially covered by a layer of radiation-sensitive material;
providing a beam of radiation using a radiation system;
using a patterning device to endow the beam with a pattern in its cross-section;
projecting the patterned beam of radiation onto a target portion of the layer of radiation-sensitive material; and
using an actuator of a lithographic apparatus within a vacuum chamber of the lithographic apparatus, the actuator comprising a coil, a magnet, and a yoke, at least one of the coil, the magnet, or the yoke having been coated with a polymer and a non-metallic material on top of the polymer, wherein said material is a glass or glass-like material.

20. A device manufacturing method comprising:
providing a beam of radiation with a radiation system;
patterning the beam of radiation with a patterning device;
projecting the patterned beam of radiation onto a layer of radiation-sensitive material disposed on a substrate; and
moving a support that supports the patterning device or the substrate with an actuator comprising a coil, a magnet, and a yoke, wherein at least one of the coil, the magnet, or the yoke has been coated on a surface thereof with a polymer and at least 30 nm to about 1 μm of a non-metallic material on top of the polymer.

21. A device manufacturing method according to claim 20, wherein the non-metallic material is a glass material.

22. A device manufacturing method according to claim 20, wherein the non-metallic material is hydrogen silsesquioxane or a silsesquioxane precursor with one or more hydrogen carbon groups attached.

* * * * *